United States Patent [19]

Ogawa et al.

[11] 4,323,864
[45] Apr. 6, 1982

[54] BINARY TRANSVERSAL FILTER

[75] Inventors: Kazuo Ogawa, Tokyo; Eiji Suzuki, Kawasaki; Osamu Kurita, Yokosuka; Izumi Horikawa, Yokohama, all of Japan

[73] Assignees: Fujitsu Limited, Kawasaki; Nippon Telegraph and Telephone Public Corp., Tokyo, both of Japan

[21] Appl. No.: 126,528

[22] Filed: Mar. 3, 1980

[30] Foreign Application Priority Data

Mar. 2, 1979 [JP] Japan .................................. 54-24982

[51] Int. Cl.³ ...................... H03H 15/00; H03H 17/06
[52] U.S. Cl. .................................... 333/165; 333/166; 364/724
[58] Field of Search ............... 333/165, 166, 18, 28 R; 307/221 R, 221 C, 269; 328/37, 165, 167, 37; 375/25, 26, 34, 96, 103, 104; 364/724

[56] References Cited

U.S. PATENT DOCUMENTS 3,521,170  7/1970  Leuthold et al. ............... 328/37 X
3,543,009  11/1970  Voelcker, Jr. .................. 333/166 X
3,801,934  4/1974  Van Gerwen ..................... 333/166

OTHER PUBLICATIONS van Gerwin et al.–"Data Modems with Integrated Digital Filters and Modulators", IEEE Trans. on Communication Technology, vol. COM-18, No. 3, Jun. 1970; pp. 214–222.
Feher et al.–"Transversal Filter Design and Application in Satellite Communications", IEEE Trans. on Communications, Nov. 1976; pp. 1262–1267.

*Primary Examiner*—Marvin L. Nussbaum

[57] ABSTRACT

A binary transversal filter which has a plurality of stages of shift registers that are driven by timing signals of a frequency which is a multiple of that of clock pulses being introduced, and a weighting circuit which weights outputs of shift registers of each of the stages, so that outputs of the weighting circuit can be synthesized. The characteristic feature of the present invention resides in the facts that NRZ signals are introduced into the shift registers, and the shift registers are driven by timing signals of a frequency which is a multiple of that of clock pulses of the NRZ signals.

7 Claims, 9 Drawing Figures

Fig. 1B
PRIOR ART

|    | Q-n | Q-n+1 | Q-n+2 | Q-n+3 | Q-n+4 | Q-n+5 | --- | Qn |
|----|-----|-------|-------|-------|-------|-------|-----|-----|
| t1 | 1   | 0     | 0     | 0     | 0     | 0     | --- |    |
| t2 | 0   | 1     | 0     | 0     | 0     | 0     | --- |    |
| t3 | 0   | 0     | 1     | 0     | 0     | 0     | --- |    |
| t4 | 0   | 0     | 0     | 1     | 0     | 0     | --- |    |
| t5 | 0   | 0     | 0     | 0     | 1     | 0     | --- |    |
| t6 | 0   | 0     | 0     | 0     | 0     | 1     | --- |    |

Fig. 3B

|  | $Q_{-n}$ | $Q'_{-n}$ | $Q_{-n+1}$ | $Q'_{-n+1}$ | $Q_{-n+2}$ | $Q'_{-n+2}$ | $Q_{-n+3}$ | $Q'_{-n+3}$ | $Q_{-n+4}$ | $Q'_{-n+4}$ | --- | --- | $Q_n$ | $Q'_n$ |
|---|---|---|---|---|---|---|---|---|---|---|---|---|---|---|
| $t_1$ | — | ○ | ○ | ○ | ○ | ○ | ○ | ○ | ○ | ○ | --- | --- | --- | --- |
| $t_2$ | ○ | — | ○ | ○ | ○ | ○ | ○ | ○ | ○ | ○ | | | | |
| $t_3$ | ○ | ○ | ○ | — | ○ | ○ | ○ | ○ | ○ | ○ | | | | |
| $t_4$ | ○ | ○ | ○ | ○ | ○ | ○ | — | — | ○ | ○ | | | | |
| $t_5$ | ○ | ○ | ○ | ○ | ○ | ○ | ○ | ○ | ○ | ○ | | | | |
| $t_6$ | | | | | | | | | | | | | | |

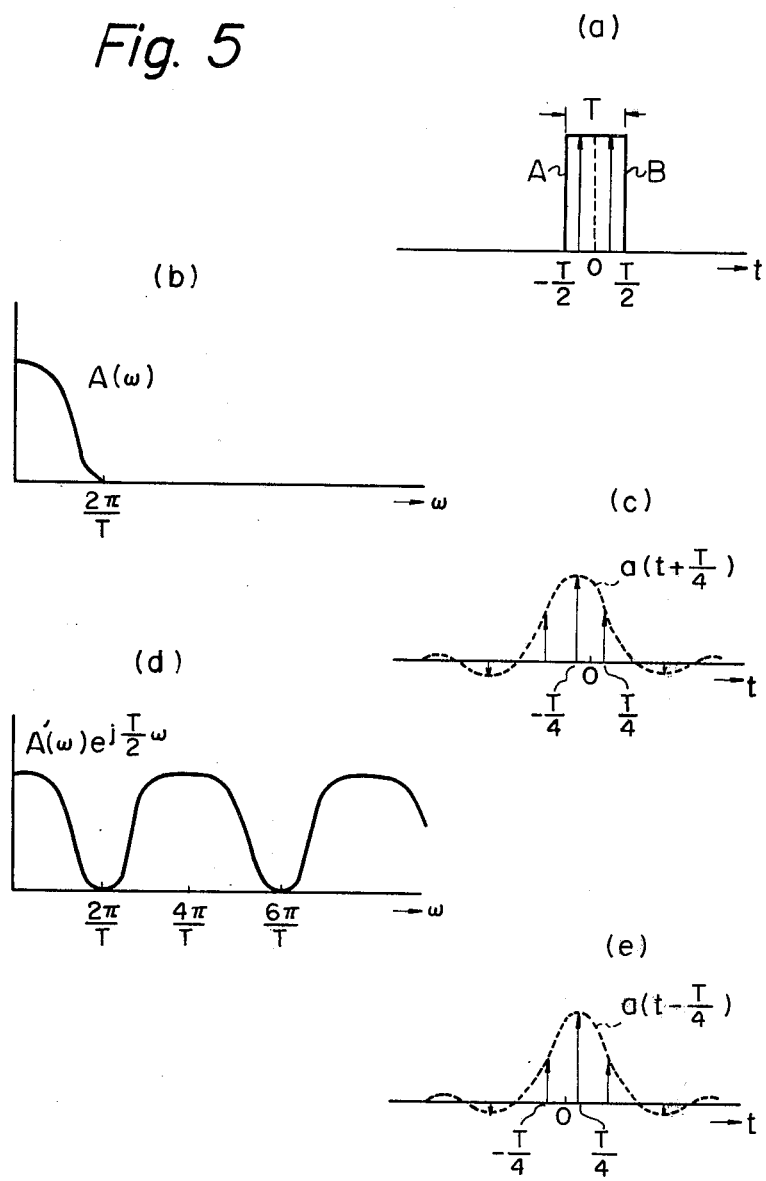

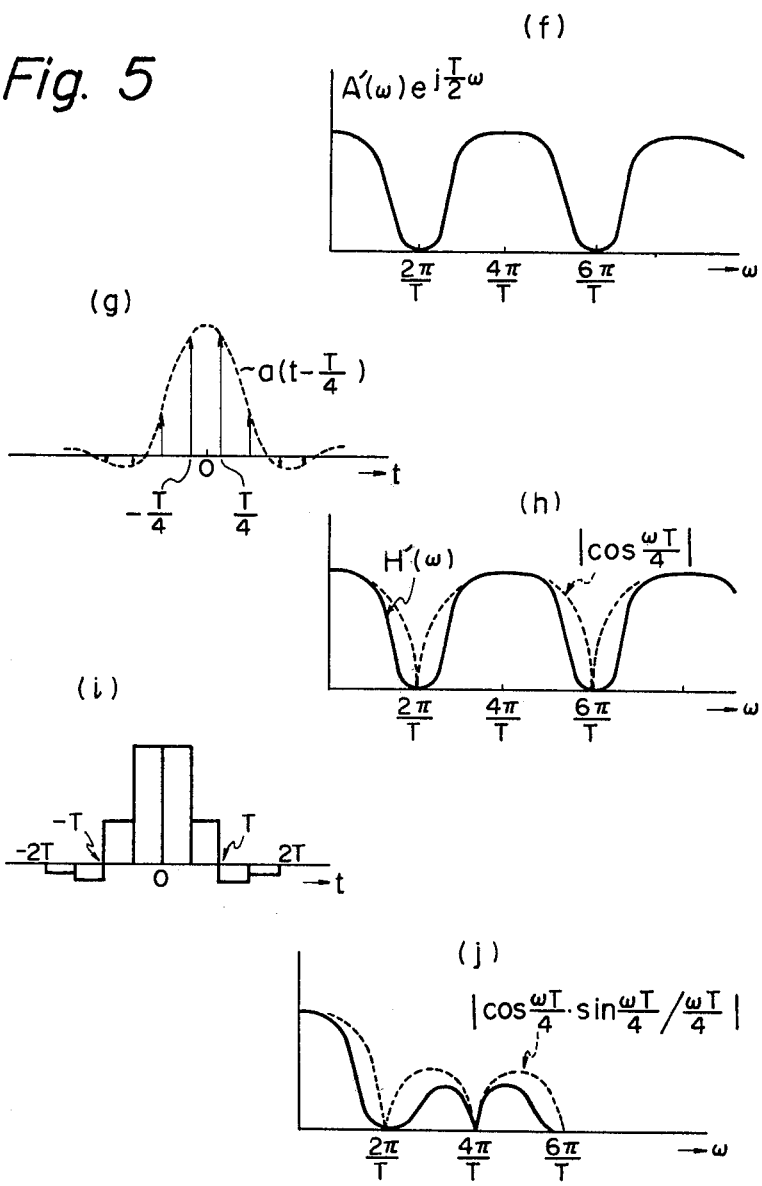

BINARY TRANSVERSAL FILTER

BACKGROUND OF THE INVENTION

The present invention relates to a binary transversal filter and, more specifically, to a binary transversal filter which is principally used in digital radio-relay systems.

Digital radio-relay systems are dependent upon a complicated transmission system, such as cosine roll-off filtering or the like, in order to effectively utilize the frequency and to reduce interference among codes being transmitted. In the above mentioned transmission system, a binary transversal filter made up of digital integrated circuits is employed.

Disclosure of a conventional binary transversal filter can be found, for example, in IEEE Transactions on Communication Technology, Vol. COM-16, No. 1, February, 1968 pp. 81–93, Herbert B. Voelcker: "Generation of Digital Signaling Waveforms". According to the binary transversal filter disclosed in this article, when it is desired to drive a plurality of stages of shift registers by timing signals to a frequency which is M times greater than that of the clock pulses of the NRZ (non-return-to-zero) signals being introduced, the introduced NRZ signals are converted into RZ (return-to-zero) signals of a pulse width T/M (wherein T denotes a repetitive period of the input NRZ signals) and are fed to the shift registers, and the outputs of the shift registers of each of the stages are synthesized to produce output signals. A tap coefficient for weighting the outputs of shift registers of each of the stages can be found based upon a sampling value at a time of an interval T/M of impulse response of the filter. For example, if it is assumed that M=2, the tap coefficient can be obtained by $$a_n = a\left(\frac{nT}{2}\right) = \frac{T}{4\pi} \int_{-\frac{2\pi}{T}}^{\frac{2\pi}{T}} H(\omega) e^{jn\frac{T}{2}\omega} d\omega \quad (1)$$

where a(t) denotes an impulse response of a transfer function $H(\omega)$ which is being found.

The tap coefficient given by the above equation (1), however, only holds true when the signals are introduced in the form of impulses. Actually, rectangular pulses of a width of T/2 (M=2) are introduced, and, therefore, the tap coefficient $a_n'$ is given by $$a_n' = a'\left(\frac{nT}{2}\right) = \frac{T}{4\pi} \int_{-\frac{2\pi}{T}}^{\frac{2\pi}{T}} H(\omega) \frac{\frac{\omega T}{4}}{\sin\left(\frac{\omega T}{4}\right)} e^{jn\frac{T}{2}\omega} d\omega \quad (2)$$

According to the above-mentioned conventional techniques in which the input NRZ signals are converted into RZ signals and are fed to the shift registers, however, the RZ signals thus converted contain frequency components of the clock pulses giving rise to the occurrence of a spike carrier corresponding to the frequency spectrum of the clock pulses, and the frequency components corresponding to this frequency spectrum are radiated into space as spurious components which fall outside the transmission band. With the conventional technique, therefore, other communications circuits relying upon the above-mentioned frequency components were often disturbed. In addition, a converter for converting the NRZ signals into RZ signals tends to become more complicated in construction with an increase in the multiplier M.

SUMMARY OF THE INVENTION

The object of the present invention is to provide a binary transversal filter which is so constructed as to eliminate the spike carrier which is caused by the frequency components of clock pulses and to suppress unnecessary spurious components that fall outside the transmission band.

Another object of the present invention is to provide a binary transversal filter in which the NRZ signals being introduced are not converted into RZ signals but are allowed to be directly fed to the shift registers.

In order to achieve the above-mentioned objects, the present invention deals with a binary transversal filter which has a plurality of stages of shift registers that are driven by timing signals of a frequency which is a multiple of that of the clock pulses being introduced, and a weighting circuit for weighting outputs of shift registers of each of the stages, where the outputs of the weighting circuit can be synthesized. The NRZ signals are fed to the shift registers, the shift registers are driven by timing signals of a frequency which is M times that of the clock pulses of the NRZ signals, and each tap coefficient $a_n$ of the weighting circuit, which is connected to the shift registers of each of the stages, is given by a sampling value of an interval T/M of an inverse Fourier transformation a(t) of $$A(\omega) = \frac{H(\omega)}{\sum\limits_{N=1}^{M} e^{j\omega\left(\frac{M-2N+1}{2M}\right)T}}$$

where $H(\omega)$ denotes a transfer function which gives a response being found, and T denotes a repetitive period of the input NRZ signals.

Further features and advantages of the present invention will become apparent from the ensuing description, with reference to the accompanying drawings, to which, however, the scope of the invention is in no way limited.

BRIEF DESCRIPTION OF THE DRAWING

FIGS. 1A and 1B are respectively a block diagram illustrating a conventional binary transversal filter, and a timing diagram illustrating the flow of input signals, FIG. 2 provides diagrams respectively illustrating output waveforms of the binary transversal filter of FIG. 1, and the frequency spectrum of the binary transversal filter;

FIGS. 3A and 3B are respectively a block diagram showing the principle of a binary transversal filter according to the present invention, and a timing diagram illustrating the flow of input signals;

FIG. 5 provides diagrams showing waveforms at each of the portions of the binary transversal filter of the present invention and their respective frequency spectra.

DESCRIPTION OF THE PREFERRED EMBODIMENTS

Figure 1A:
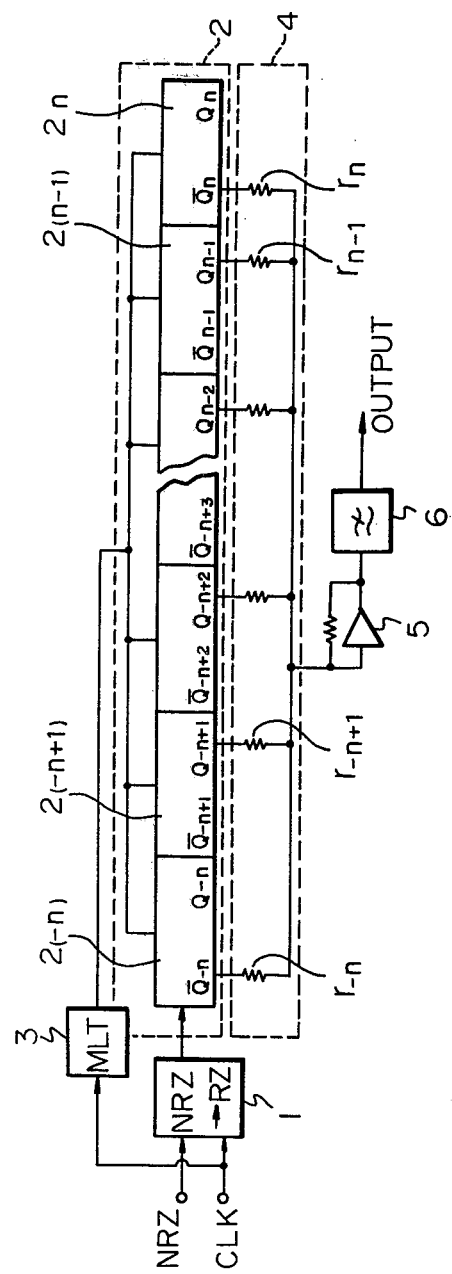
Figure 2:
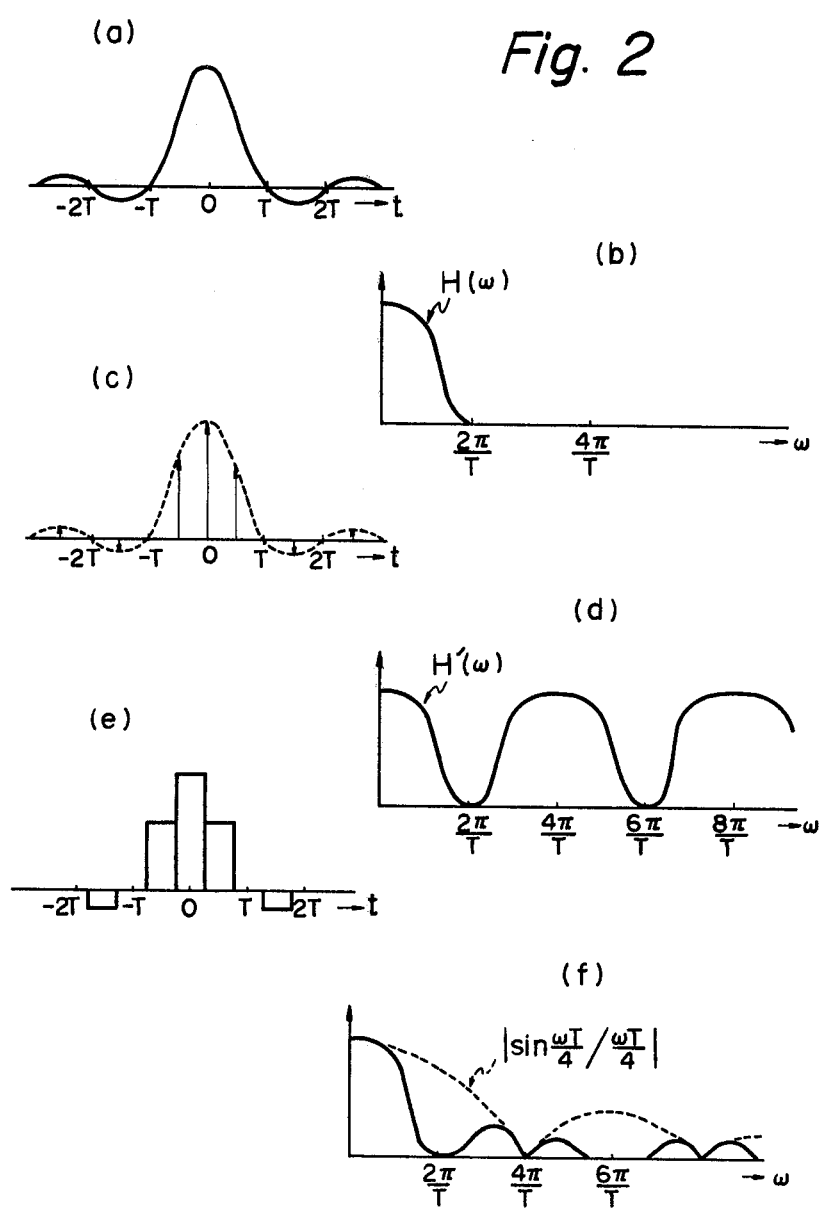

FIG. 1A is a block diagram showing a conventional binary transversal filter which consists of: a converter 1, which introduces NRZ signals and converts them into RZ signals; a shift register 2, of a plurality of stages 2(−n), 2(−n+1), ... 2(n−1), 2(n), which receives outputs of the converter 1; a multiplier circuit 3, which multiplies the frequency of clock pulses CLK so that the shift register 2 is driven by the multiplied timing signals; a weighting circuit 4 consisting of resistors $r_{(-n)}$, $r_{(-n+1)}$, ... $r_{n-1}$, $r_n$, which are connected to output terminals of each of the stages of the shift register 2; an amplifier circuit 5, which synthesizes the outputs of the weighting circuit 4 and amplifies the synthesized output to a predetermined level; and a low-pass filter (LPF) 6 for removing unnecessary components from the outputs of the amplifier circuit 5. FIG. 1B shows the state in which an RZ signal introduced to the shift register 2 at a time $t_1$ is shifted in the shift register 2 by the timing outputs of the multiplier circuit at times $t_2, t_3, \ldots$ FIG. 2 shows one example of output waveforms of the binary transversal filter of FIG. 1A, and its frequency spectrum. The diagram (a) of FIG. 2 shows an output waveform that is to be found, and the diagram (b) shows a frequency spectrum of the waveform shown in diagram (a). In the diagram (b), the abscissa represents angular frequency and the ordinate represents spectrum density. With reference to the diagram (b), the frequency spectrum of the output that is to be found becomes zero at a frequency 1/T. If the waveform of diagram (a) is sampled with impulses of an interval T/2 as shown in the diagram (c), the frequency spectrum of the impulses becomes as shown in the diagram (d). In the practical hardware, rectangular pulses of a width T/2 are introduced as shown in the diagram (e). The frequency spectrum, therefore, becomes as shown in the diagram (f).

According to the conventional filter as mentioned above, since the RZ signals contain large amounts of clock pulse components, a spike carrier having frequency components of the clock pulses appears at frequencies 1/T, 2/T, ... and causes unnecessary spurious components that fall outside the transmission band.

Figure 3A:
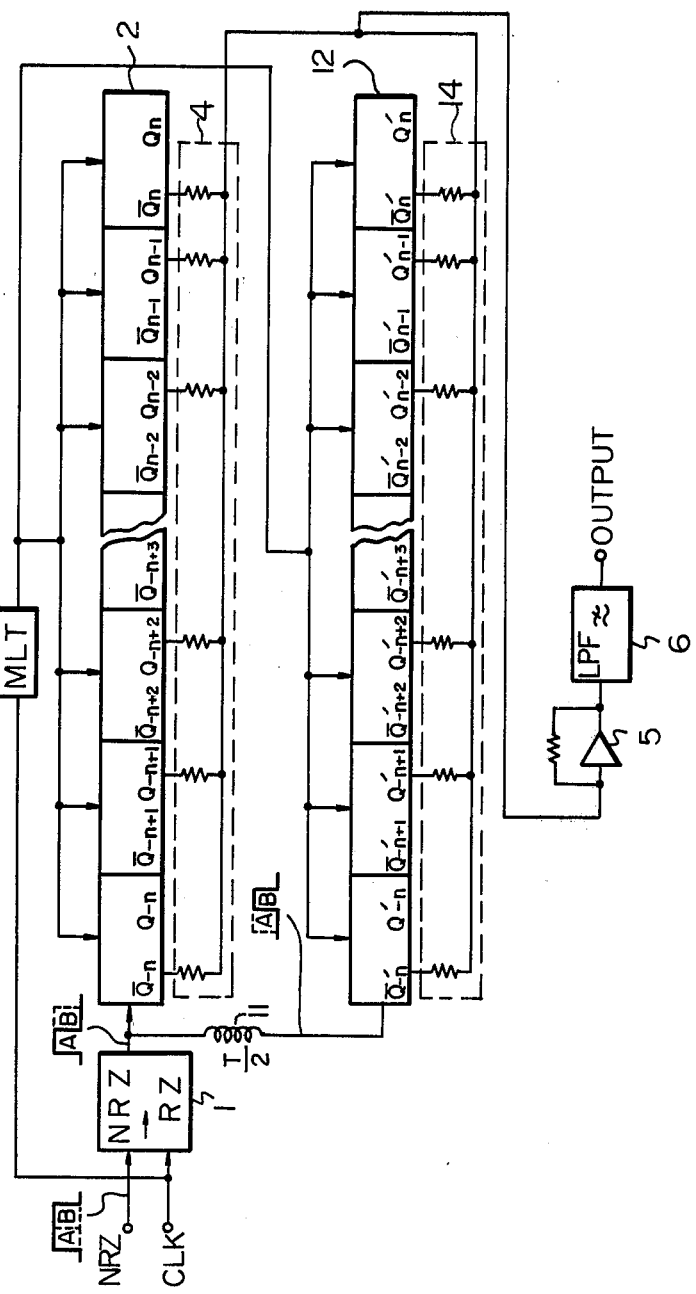

The principal object of the present invention is to eliminate unnecessary spurious components. The fundamental principle of the present invention is illustrated in FIG. 3A. With reference to FIG. 3, the present invention consists of a modification of the circuit of FIG. 1A, wherein an RZ signal which is delayed by a time T/2 by a delay circuit 11, i.e., an RZ signal which is out of phase with respect to the output of the converter 1 is fed to a shift register 12, and outputs of each of the stages of the shift register 12 are taken out via a weighting circuit 14 and are synthesized, to obtain the sum of the thus synthesized output of the weighting circuit 14 and the resultant output of the weighting circuit 4. With reference to the RZ signal components, therefore, the resultant output of the weighting circuit 4 and the resultant output of the weighting circuit 14 are added together, but spike carrier components of clock pulses acquire the opposite phase and are removed. In this case, tap coefficients of the weighting circuits 4 and 14 must be selected to be suitable values that are different from those of the conventional filters.

Figure 3B:
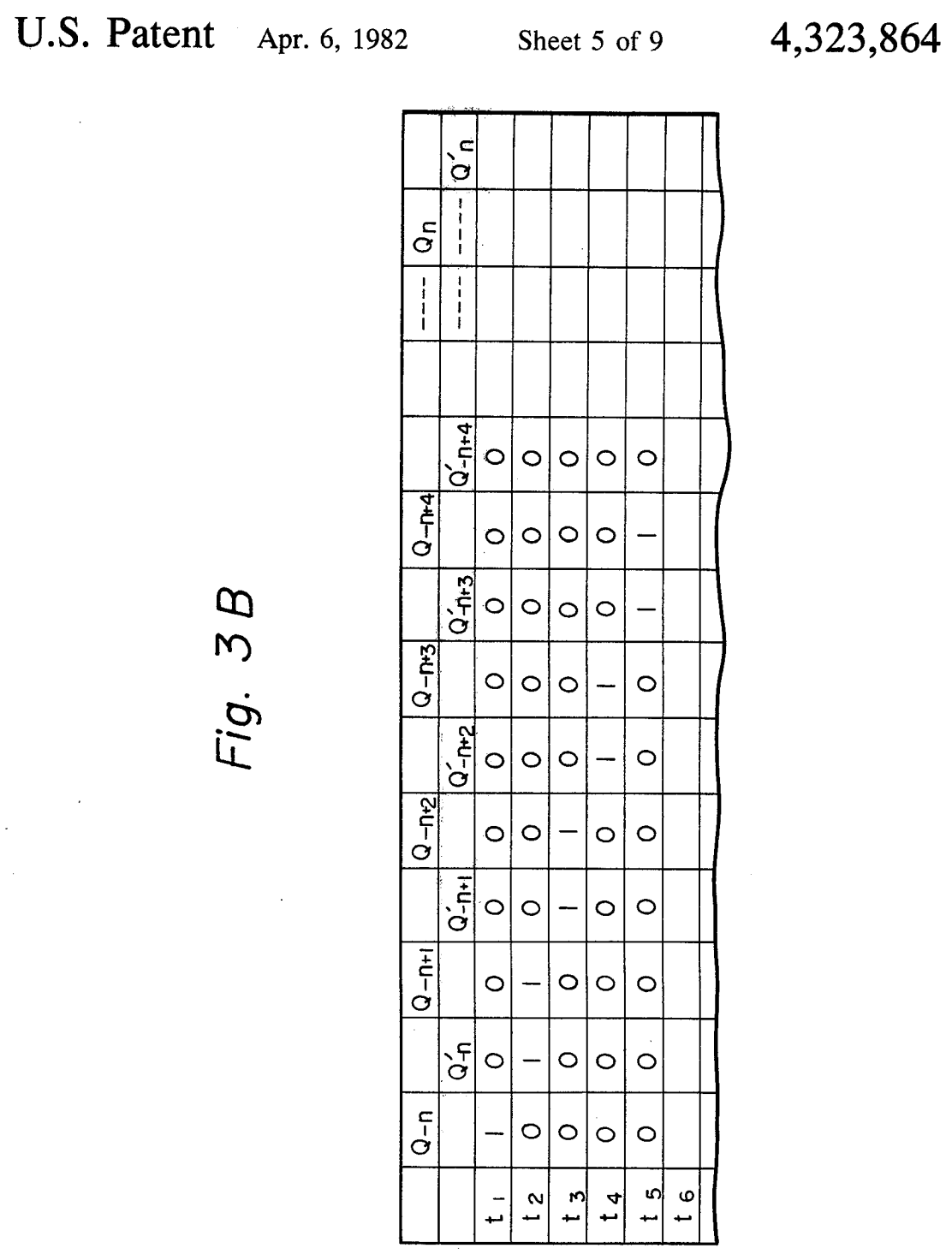

FIG. 3B is a time chart illustrating the flow of RZ signals.

According to the circuit illustrated in FIG. 3A, the RZ signals A and the RZ signals B which lag by T/2 behind the RZ signals A are introduced into the shift register 2 and into the weighting circuit 14, and are processed. However, since the RZ signals A and the RZ signals B which are synthesized together are equivalent to the original NRZ signals, the present invention feeds the NRZ signals directly to a shift register to process them as illustrated in FIG. 4A.

Figure 4A:
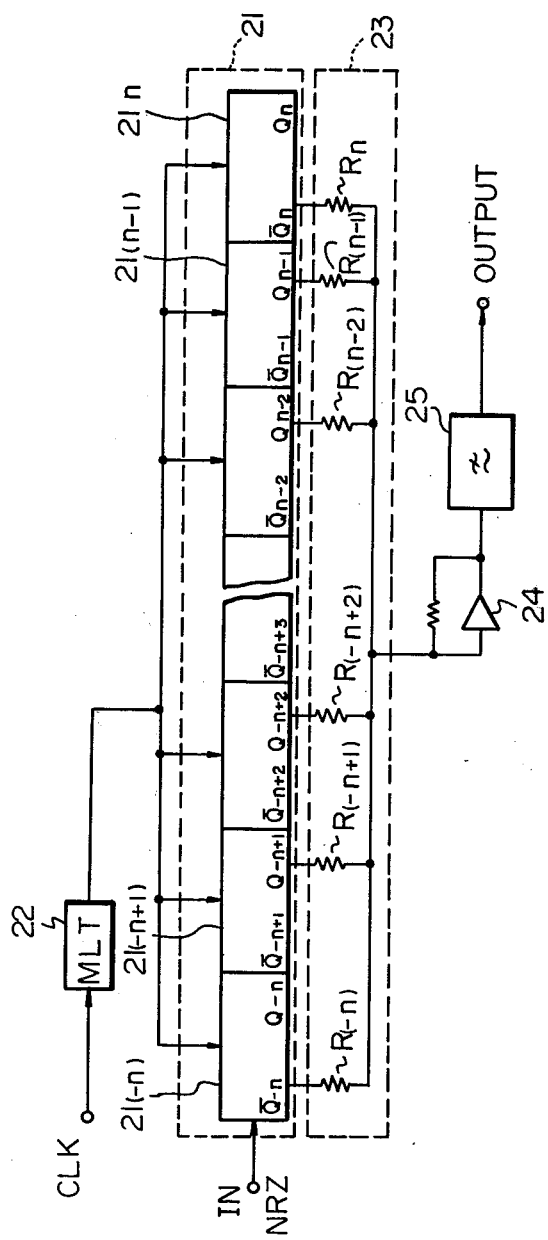
FIGS. 4A, 4B, and 4C are respectively a block diagram illustrating a binary transversal filter according to the present invention, a timing diagram illustrating the flow of input signals, and a waveform diagram showing relations among NRZ signals, RZ signals, and clock pulse signals.
Figures 4B, 4C:
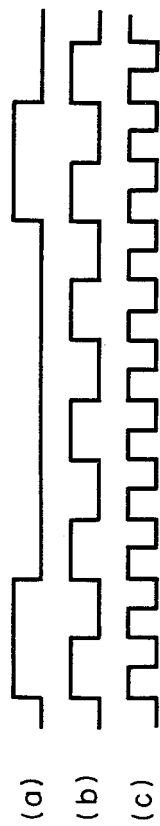

With reference to FIG. 4A, an input terminal IN introduces the NRZ signal, which is directly applied to an input stage $21_{(-n)}$ of a shift register 21 consisting of a plurality of stages $21_{(-n)}$, $21_{(-n+1)}$, ... $21_{(n-1)}$, $21_{(n)}$. On the other hand, the frequency of the clock pulses CLK is doubled by a multiplier circuit 22, whereby the shift register 21 is driven by timing signals of the doubled frequency. The outputs of each of the stages of the shift register 21 are fed to an operational amplifier 24 via weighting resistors $R_{(-n)}$, $R_{(-n+1)}$, ... $R_{(n-1)}$, $R_{(n)}$ of a weighting circuit 23, and the output of the operational amplifier 24 is produced via a low-pass filter 25, which removes frequency components greater than 2/T. FIG. 4B shows the state in which the NRZ signal fed to the input terminal of the shift register 21 at a time $t_1$ is shifted in the shift register 21 by the timing signals of the multiplier circuit 22 after the lapse of times $t_2, t_3, \ldots$ FIG. 4C shows a relation between the NRZ signals and the clock pulses in the circuit of FIG. 4A, in which diagram (a) shows NRZ signals, the diagram (b) shows clock pulses and the diagram (c) shows outputs of the multiplier circuit.

The weighting circuit 23 in the circuit of FIG. 4A is described below in detail with reference to FIG. 5.

With reference to the diagram (a) of FIG. 5, when M=2, the input NRZ signal can be considered to be composed of pulses A and B, each having a pulse width T/2. By using impulses $\delta_a(t-T/4)$ and $\delta_b(t+T/4)$ instead of the above-mentioned pulses A and B, let it be assumed that the impulse response at t=0 of the binary transversal filter is given by a(t) and the spectrum of the impulse response, is as given by A(ω) of the diagram (b) of FIG. 5. Then, the synthetic waves of the two impulse responses, and the spectrum thereof, are given by $$a\left(t - \frac{T}{4}\right) + a\left(t + \frac{T}{4}\right) \rightleftharpoons A(\omega) e^{j\frac{\omega T}{4}} + A(\omega) e^{-j\frac{\omega T}{4}} = A(\omega) 2\cos\left(\frac{\omega T}{4}\right) \quad (3)$$

This is because, when $a(t) \rightleftharpoons A(\omega)$, we obtain $a(t-t_0) \rightleftharpoons A(\omega)e^{j\omega t_0}$. Here, the symbol $\rightleftharpoons$ indicates that the Fourier transform of the left side is the right side, and the inverse Fourier transform of the right side is the left side.

The synthetic wave should serve as an impulse response for the transfer characteristics H(ω) of a filter that is to be materialized. Therefore, if the transfer characteristics H(ω) are given, there is obtained from the equation (3)

$$A(\omega) = \frac{H(\omega)}{2\cos\frac{\omega T}{4}} \quad (4)$$

Therefore, the tap coefficient $a_n$ is given by a sampling value of an interval T/2 of an inverse Fourier transform a(t) of $A(\omega)$. If it is assumed that $A(\omega)=0$ in $|\omega|>2\pi/T$, then $$a_n = a\left(\frac{nT}{2}\right) = \frac{T}{4\pi} \int_{-\frac{2\pi}{T}}^{\frac{2\pi}{T}} \frac{H(\omega)}{2\cos\left(\frac{\omega T}{4}\right)} e^{j\frac{nT}{2}\omega} d\omega \quad (5)$$

The above equation (5), however, holds true when impulses are introduced. When rectangular pulses whose spectrum is given by $\sin \omega T/4 / \omega T/4$ are to be introduced, the inverse of this spectrum function is multiplied into the integrand to make the rectangular pulses equivalent to impulse inputs. The equation (5), therefore, can be rewritten as $$a_n = a\left(\frac{nT}{2}\right) = \quad (6)$$

$$\frac{T}{4\pi} \int_{-\frac{2\pi}{T}}^{\frac{2\pi}{T}} \frac{H(\omega) \frac{\omega T}{4}}{2\cos\left(\frac{\omega T}{4}\right) \sin\left(\frac{\omega T}{4}\right)} e^{j\frac{nT}{2}\omega} d\omega$$

Accordingly, values of the resistors $R_{-n}$ to $R_n$ connected to each of the stages of the shift register 21 of FIG. 4A should be so selected that they will be proportional to the inverses of their respective tap coefficients $a_{-n}$ to $a_n$.

When M=2, from the above equation (4), there is obtained a relation $$H(\omega)=A(\omega) 2 \cos(\omega T/4) \quad (7)$$

Therefore, the value $H(\omega)$ necessarily becomes zero at $\omega=2\pi/T, 6\pi/T, 10\pi/T$. Consequently, the frequency components of clock pulses of 1/T can be suppressed irrespective of the tap coefficients.

The dotted lines of diagrams (c) and (e) of FIG. 5 represent impulse responses $a(t+T/4)$ and $a(t-T/4)$, and the solid arrows represent impulse trains for taking sampling values at an interval T/2. Diagrams (d) and (f) of FIG. 5 illustrate frequency spectra of the impulse trains of the sampled values. Diagrams (g) and (h) of FIG. 5 illustrate impulse trains for taking sampling values of the resultant impulse response and its frequency spectrum. Diagram (i) of FIG. 5 shows a resultant output (input of the low-pass filter 25) produced under practical operating conditions, i.e., when an NRZ signal is introduced, and the diagram (j) of FIG. 5 shows a frequency spectrum of the resultant output. Here, $A'(\omega)=A(\omega)$ when $|\omega|<2\pi/T$ or, otherwise, $A'(\omega)=A'(\omega+n4\pi/T)$ and $H'(\omega)=H(\omega)$ when $|\omega|<2\pi/T$ or, otherwise, $H'(\omega)=H'(\omega+n.4\pi/T)$.

As illustrated in detail in the foregoing, according to the present invention, in which the input NRZ signals are directly fed to the shift register, there is no need of employing the means for converting NRZ signals into RZ signals which is used in the conventional binary transversal filters. When the shift registers are driven by timing signals of a frequency two times that of clock pulses of the input NRZ signals, the transfer characteristics become zero at a clock frequency 1/T, as given by the equation (7), making it possible to suppress clock components.

When M is not 2, the term $\cos \omega T/4$ in the equation (3) should be replaced by $$\sum_{N=1}^{M} e^{j\omega\left(\frac{M-2N+1}{2M}\right)T}$$

Therefore, when M=3, the equation corresponding to the equation (7) can be given by $$H(\omega)=A(\omega)(1+2\cos \omega T/3) \quad (8)$$

and when M=4, the equation corresponding to the equation (7) can be given by $$H(\omega)=4A(\omega)\cos(\omega T/4)\cos(\omega T/8) \quad (9)$$

Thus, as will be understood from the equations (8) and (9), when M is an even number, there are present two effects, i.e., suppressing the clock frequency components and obviating the need for NRZ-RZ conversion. When M is an odd number, however, the clock components are not suppressed, but the NRZ-RZ conversion is still not required.

What is claimed is:

1. A binary transversal filter for receiving NRZ input signals synchronously with clock pulses, comprising:
a shift register, to which the NRZ input signals are fed directly, said register including a plurality of stages which are driven by timing signals of a frequency that is a multiplier M times that of the clock pulses of the input signals,
a weighting circuit for weighting and synthesizing the outputs of each of the stages of said shift register, and
a tap coefficient $a_n$ of said weighting circuit connected to each of the stages of said shift register being given by a sampling value of an interval T/M of an inverse Fourier transform a(t) of $$A(\omega) = \frac{H(\omega)}{\sum_{N=1}^{M} e^{j\omega\left(\frac{M-2N+1}{2M}\right)T}}$$

wherein $H(\omega)$ denotes a transfer coefficient which gives a response that is to be found, T denotes a repetitive period of the input NRZ signals, and M represents said multiplier.

2. A binary transversal filter as set forth in claim 1, wherein said shift register is driven by timing signals of a frequency two times that of the clock pulses of said NRZ signals, and said tap coefficient $a_n$ of said weighting circuit connected to each of the stages of said shift register is given by a sampling value of an interval T/2 of an inverse Fourier transform a(t) of $$A(\omega) = \frac{H(\omega)}{2\cos\frac{\omega T}{4}}$$

where $H(\omega)$ denotes a transfer coefficient which gives a response that is to be found, and T denotes a repetitive period of the input NRZ signals.

3. The filter of claim 1 or 2, wherein:

each said tap coefficient $a_n$ of said weighting circuit is realized as a resistor having a value $R_n$ such that the product of $R_n$ and $a_n$ is constant for the filter.

4. The filter of claim 3, further comprising:
an operational amplifier, operatively connected to all of said resistors.

5. The filter of claim 4, further comprising:
a low-pass filter operatively connected to the output of said operational amplifier.

6. A binary transversal filter for receiving an NRZ input having a clock frequency 1/T and processing said input according to a transfer characteristic $H(\omega)$ comprising:
a multiplier circuit for detecting the clock frequency of the NRZ input and generating timing signals at a frequency which is a preselected multiple M of the clock frequency;
a shift register comprising (2n+1) sequentially connected stages, each stage being operatively connected to the timing signals generated by said multiplier circuit, and the first one of said stages being directly connected to the NRZ input; and
a plurality of resistors, respectively connected at one terminal of each thereof to a corresponding stage of said shift register and connected at the other terminal of each thereof to a common output terminal to provide an output of said filter, wherein the value $R_k$ of the respective one of said resistors which is connected to the k-th stage of said shift register is given in relation to an arbitrary real constant C by:

$$\frac{C}{R_k} = \frac{T}{4\pi} \int_{-\frac{2\pi}{T}}^{\frac{2\pi}{T}} \frac{H(\omega) \frac{\omega T}{4} \cdot \exp\left(j \frac{T\omega(k-n-l)}{2}\right)}{2\cos\left(\frac{\omega T}{4}\right) \sin\left(\frac{\omega T}{4}\right)} d\omega.$$

7. The filter of claim 6, further comprising:
a low-pass filter, operatively connected between said common connection of said resistors and the output of said binary transversal filter.

* * * * *

UNITED STATES PATENT AND TRADEMARK OFFICE
CERTIFICATE OF CORRECTION

PATENT NO. : 4,323,864

DATED : April 6, 1982

INVENTOR(S) : Ogawa et al.

It is certified that error appears in the above—identified patent and that said Letters Patent is hereby corrected as shown below:

Front page, [56] OTHER PUBLICATIONS, "van Gerwin" should be --Van Gerwin--;

*Front page, Col. 2, after "Primary Examiner--Marvin L. Nussbaum" insert -- Attorney, Agent, or Firm--Staas & Halsey--;

Col. 2, line 11, after "of" insert --the--;

Col. 6, line 15, "A($\omega$)" (first occurrence) should be --H($\omega$)--.

Signed and Sealed this

Seventeenth Day of August 1982

[SEAL]

Attest:

Attesting Officer

GERALD J. MOSSINGHOFF

Commissioner of Patents and Trademarks